(12) United States Patent
Lin

(10) Patent No.: US 11,362,659 B2
(45) Date of Patent: Jun. 14, 2022

(54) THIN KEYBOARD APPARATUS

(71) Applicant: SUNREX TECHNOLOGY CORP., Taichung (TW)

(72) Inventor: Shih-Pin Lin, Taichung (TW)

(73) Assignee: SUNREX TECHNOLOGY CORP., Taichung (TW)

( * ) Notice: Subject to any disclaimer, the term of this patent is extended or adjusted under 35 U.S.C. 154(b) by 93 days.

(21) Appl. No.: 17/037,900

(22) Filed: Sep. 30, 2020

(65) Prior Publication Data

US 2021/0359681 A1    Nov. 18, 2021

(30) Foreign Application Priority Data

May 12, 2020    (TW) .................................. 109115696

(51) Int. Cl.
| | | |
|---|---|---|
| *H03K 17/96* | (2006.01) | |
| *G06F 3/044* | (2006.01) | |
| *G06F 3/02* | (2006.01) | |
| *H01H 13/70* | (2006.01) | |

(52) U.S. Cl.
CPC ......... *H03K 17/962* (2013.01); *G06F 3/0202* (2013.01); *G06F 3/044* (2013.01); *H01H 13/70* (2013.01)

(58) Field of Classification Search
CPC ..... H03K 17/962; H03K 2217/960755; H03K 17/9622; H03K 17/96; G06F 3/0202; G06F 3/044; G06F 3/02; H01H 13/70; H01H 13/705; H01H 13/7065; H01H 13/10; H01H 3/125
See application file for complete search history.

(56) References Cited

U.S. PATENT DOCUMENTS

| | | | | |
|---|---|---|---|---|
| 5,695,047 A | * | 12/1997 | Tanahashi .............. | H01H 3/125 200/344 |
| 5,763,842 A | * | 6/1998 | Tsai ....................... | H01H 3/125 200/345 |
| 5,770,824 A | * | 6/1998 | Tsai ....................... | H01H 3/125 200/344 |

FOREIGN PATENT DOCUMENTS

TW           M547171         8/2017

* cited by examiner

*Primary Examiner* — Lheiren Mae A Caroc
(74) *Attorney, Agent, or Firm* — Burris Law, PLLC

(57) ABSTRACT

A thin keyboard apparatus includes a base plate and a supporting unit. The base plate has a plate body which is formed with four retaining openings and four retaining members. Each retaining opening is bordered by a peripheral edge which has first and second edge sections extending along two different and intersecting directions. Each retaining member has an upper wall, a first connecting wall interconnecting the upper wall and the first edge section, a second connecting wall interconnecting the upper wall and the second edge section, and a broken hole dividing the first edge section from the second edge section. The supporting unit is slidably pivoted to the retaining members.

4 Claims, 15 Drawing Sheets

THIN KEYBOARD APPARATUS

CROSS-REFERENCE TO RELATED APPLICATION

This application claims priority of Taiwanese Patent Application No. 109115696, filed on May 12, 2020.

FIELD

The disclosure relates to a keyboard apparatus, and more particularly to a thin keyboard apparatus with capacitive keys to permit a thinner and durable design.

BACKGROUND

Referring to FIG. 1, a conventional thin-type capacitive key 9 as disclosed in TW M547171 includes a base plate 91, a membrane switch 92 disposed on the base plate 91, an elastic member 93 disposed on the membrane switch 92, a supporting mechanism 94 mounted on the base plate 91, and a keycap 95 supported by the supporting mechanism 94 and the elastic member 93. The base plate 91 includes a plate body 911 and four hooks 912 disposed on the plate body 911 and extending through the membrane switch 92 such that the supporting mechanism 94 is slidably pivoted with the hooks 912. When the keycap 95 is pressed, the supporting mechanism 94, which includes two supporting frames intersecting with each other, slides and spreads flat, and the elastic member 93 is pressed to generate a pressing signal. However, owing to the trend of thinner design, the plate body 911 of the base plate 91 is made thinner, which results in reduction of the structural strength of the hooks 912 and hence breaking of the hooks 912.

SUMMARY

Therefore, an object of the disclosure is to provide a thin keyboard apparatus that permits a thinner and durable design.

The thin keyboard apparatus includes a base plate, a pressing unit, a supporting unit and a keycap.

The base plate has a plate body which defines thereon a first axial line and a second axial line that is perpendicular to the first axial line and intersects the first axial line at a reference point. The plate body has an upper major surface which is divided by the first and second axial lines into first, second, third and fourth regions. The first region is adjoined to the second region along the second axial line, and is adjoined to the fourth region along the first axial line. The third region is adjoined to the second region along the first axial line, and is adjoined to the fourth region along the second axial line. The plate body has four retaining openings which are respectively formed in the first, second, third and fourth regions. Each of the retaining openings is bordered by a peripheral edge. The peripheral edge includes a first edge section which extends substantially parallel to and proximate to the first axial line, and a second edge section which extends substantially parallel to and remote from the second axial line. The plate body further has four retaining members which are respectively disposed in the retaining openings. Each of the retaining members has an upper wall which is spaced apart from the upper major surface of the plate body in an upright direction that is normal to the upper major surface, a first connecting wall which interconnects the upper wall and the first edge section and which extends along the first edge section, a second connecting wall which interconnects the upper wall and the second edge section and which extends along the second edge section, and a broken hole which is formed at a juncture between the first and second connecting walls to divide the first edge section from the second edge section. The upper wall, the first connecting wall and the second connecting wall cooperatively define a retaining slot.

The pressing unit is disposed on the base plate along the upright direction, and has a center pressing portion substantially located on the reference point to be pressed and generate a pressing signal.

The supporting unit is disposed on the base plate along the upright direction, and includes a first supporting frame and a second supporting frame which intersects with the first supporting frame and is pivotably joined thereto at an intersecting axis to define a supporting included angle such that the first and second supporting frames are pivotable relative to each other about the intersecting axis to vary the supporting included angle. The first supporting frame has a first surrounding frame body which surrounds the center pressing portion, and two first retaining protrusions which are disposed on the first surrounding frame body and adjacent to the plate body. The first retaining protrusions protrude from the first surrounding frame body along a direction of the first axial line and away from the second axial line and are respectively inserted into the retaining slots at the first and second regions. The second supporting frame has a second surrounding frame body which surrounds the center pressing portion and which is pivotably connected with the first surrounding frame body about the intersecting axis, and two second retaining protrusions which are disposed on the second surrounding frame body and adjacent to the plate body. The second retaining protrusions protrude from the second surrounding frame body along the direction of the first axial line and away from the second axial line and are respectively inserted into the retaining slots at the third and fourth regions.

The keycap is disposed on the supporting unit in the upright direction and opposite to the plate body, and is movable with the supporting unit in the upright direction relative to the base plate.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
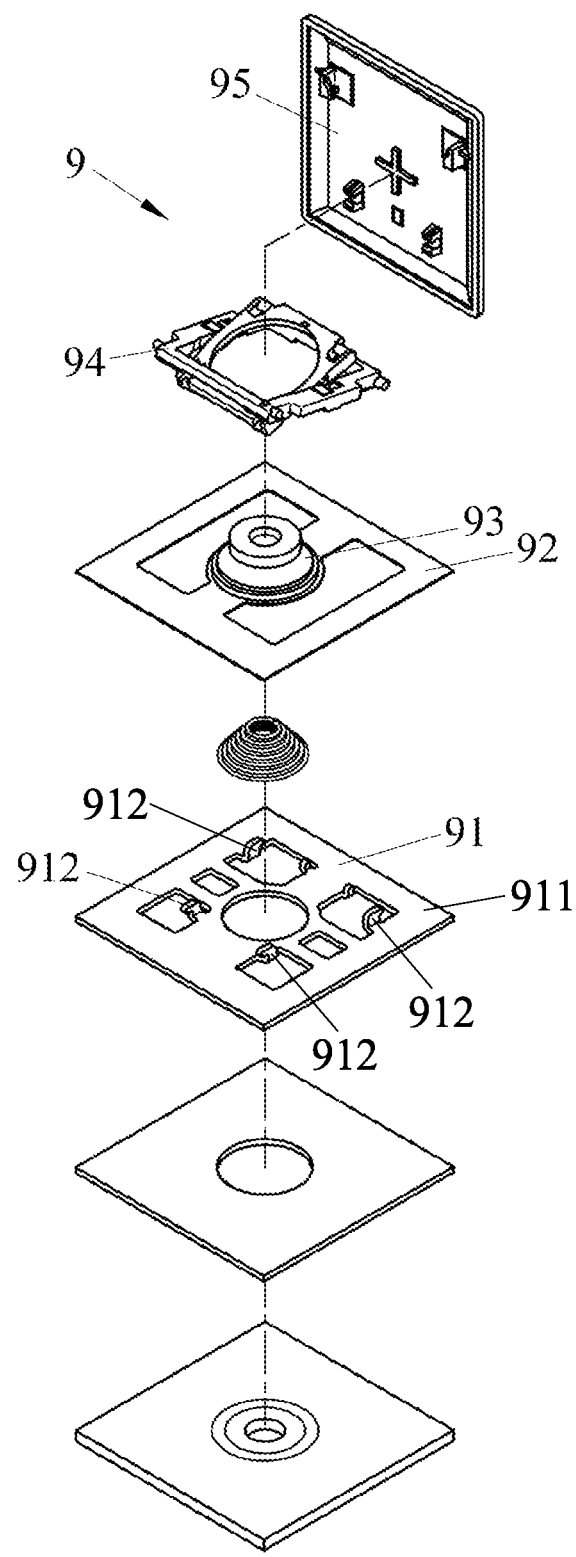
FIG. 1 is an exploded perspective view of a conventional thin-type capacitive key.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
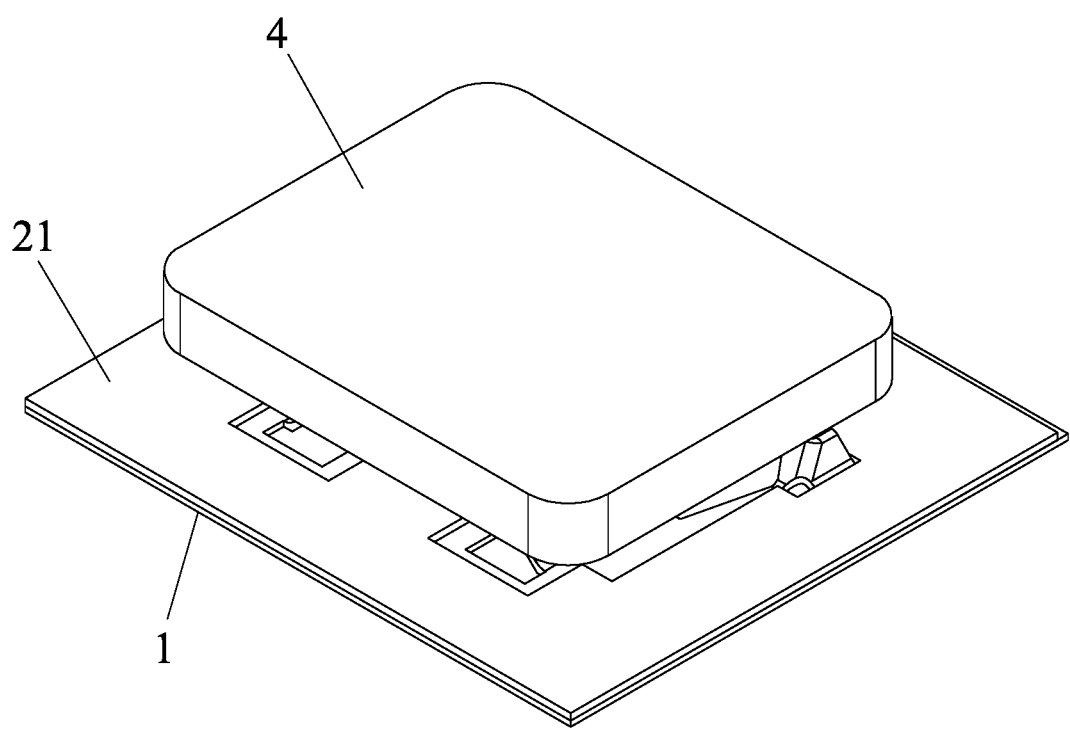
FIG. 2 is a perspective view illustrating an embodiment of a thin keyboard apparatus according to the disclosure.
Figure 3:
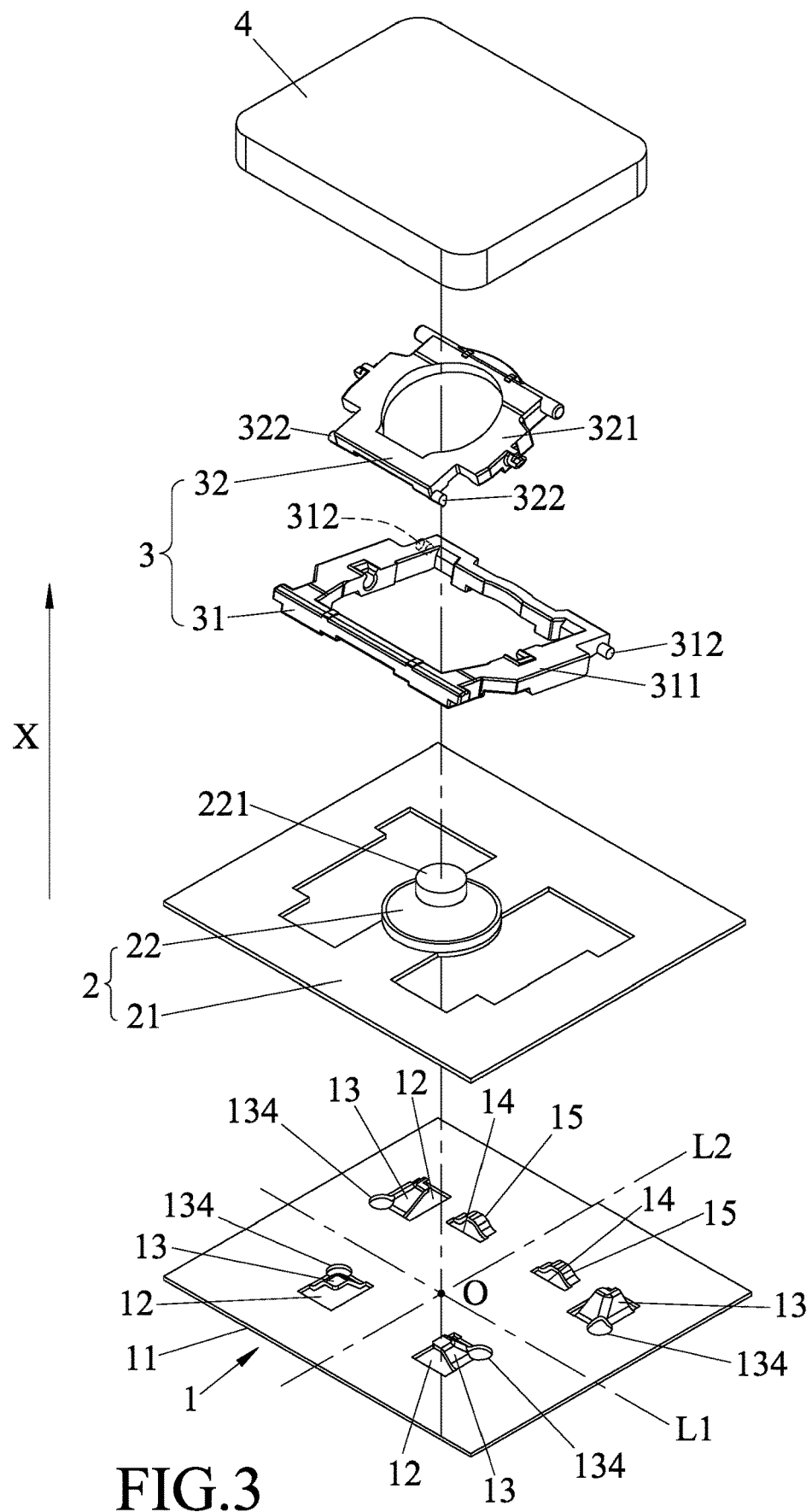
FIG. 3 is an exploded perspective view of the embodiment.

Referring to FIGS. 2 and 3, an embodiment of a thin keyboard apparatus according to the disclosure includes a base plate 1, a pressing unit 2, a supporting unit 3 and a keycap 4.

Figure 4:
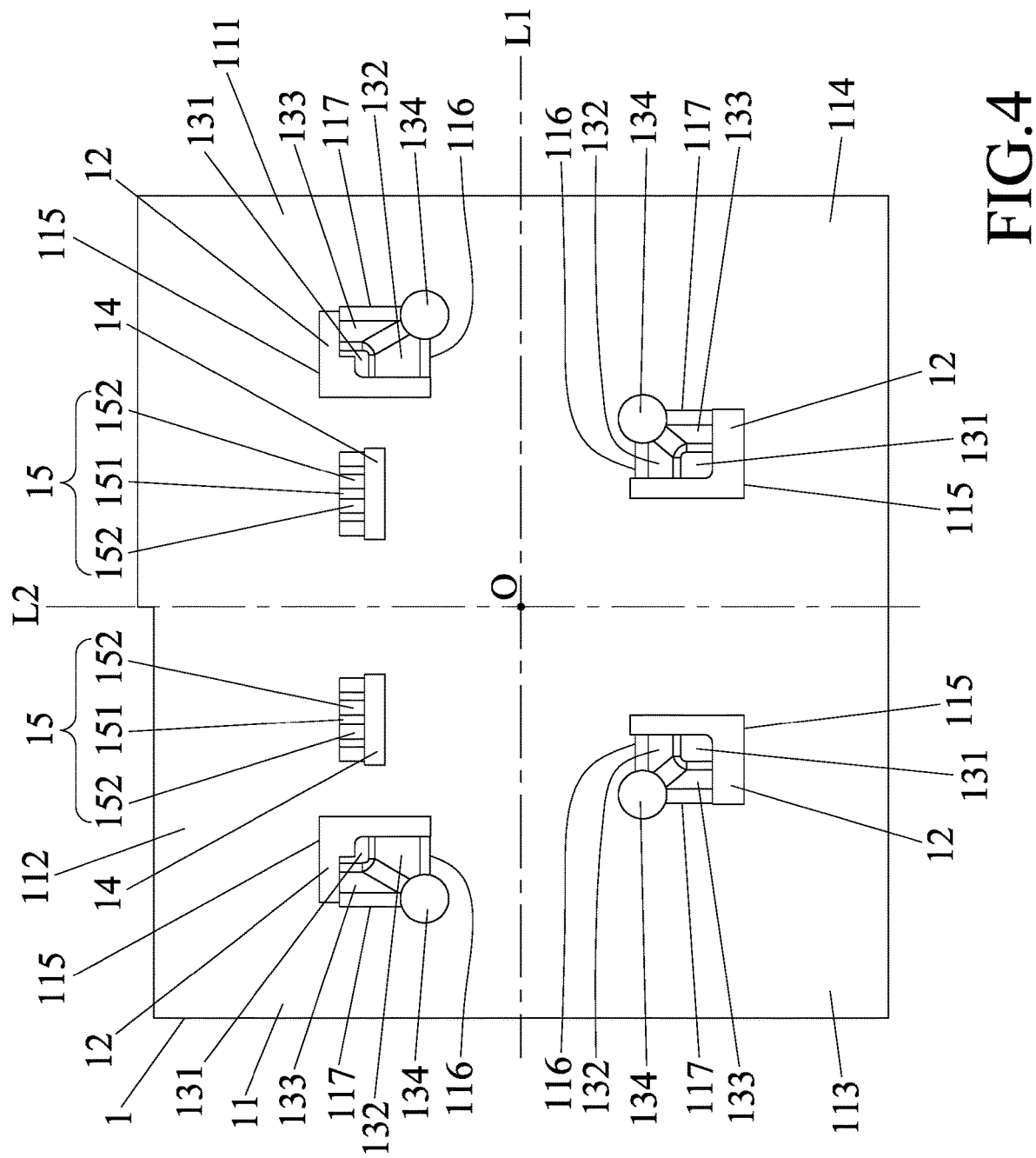
FIG. 4 is a top view of a base plate of the embodiment.
Figure 5:
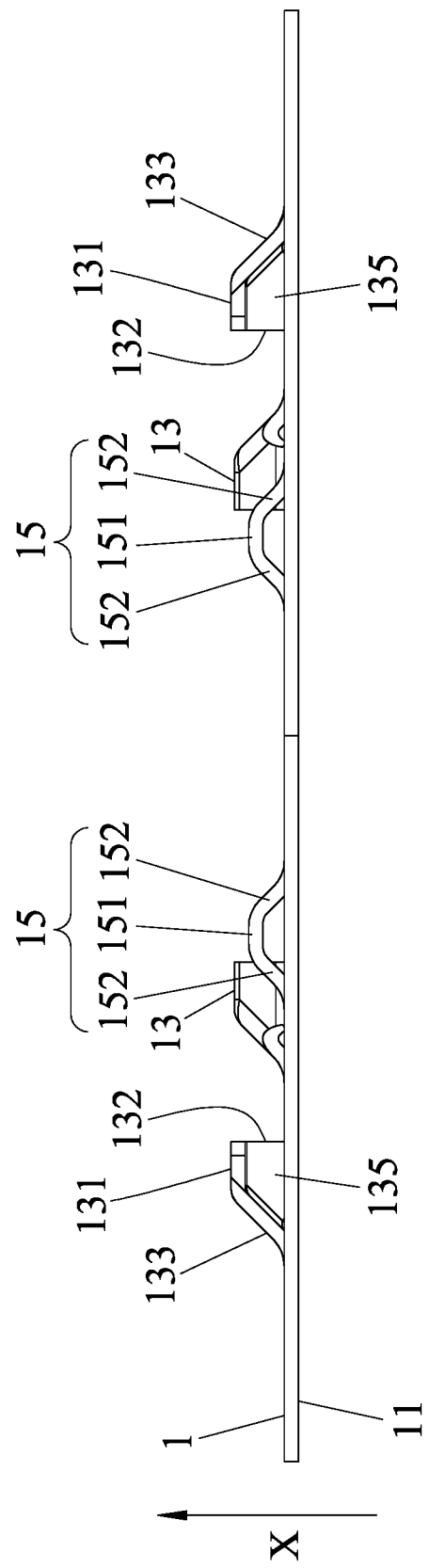
FIG. 5 is a side view of the base plate of the embodiment.

With reference to FIGS. 4 and 5, the base plate 1 has a plate body 11 which defines thereon a first axial line (L1) and a second axial line (L2) that is perpendicular to the first axial line (L1) and intersects the first axial line (L1) at a reference point (O). The plate body 11 has an upper major surface which is divided by the first and second axial lines (L1, L2) into first, second, third and fourth regions 111, 112, 113, 114. The first region 111 is adjoined to the second region 112 along the second axial line (L2), and is adjoined to the fourth region 114 along the first axial line (L1). The third region 113 is adjoined to the second region 112 along the first axial line (L1), and is adjoined to the fourth region 114 along the second axial line (L2). The plate body 11 has four retaining openings 12 which are respectively formed in the first, second, third and fourth regions 111, 112, 113, 114. Each retaining opening 12 is bordered by a peripheral edge 115. The peripheral edge 115 includes a first edge section 116 which extends substantially parallel to and proximate to the first axial line (L1), and a second edge section 117 which extends substantially parallel to and remote from the second axial line (L2). The plate body 11 further has four retaining members 13 which are respectively disposed in the retaining openings 12.

Each retaining member 13 has an upper wall 131 which is spaced apart from the upper major surface of the plate body 11 in an upright direction (X) that is normal to the upper major surface, a first connecting wall 132 which interconnects the upper wall 131 and the first edge section 116 and which extends along the first edge section 116, a second connecting wall 133 which interconnects the upper wall 131 and the second edge section 117 and which extends along the second edge section 117, and a broken hole 134 which is formed at a juncture between the first and second connecting walls 132, 133 to divide the first edge section 116 from the second edge section 117. The upper wall 131, the first connecting wall 132 and the second connecting wall 133 cooperatively define a retaining slot 135.

The plate body 11 further has two stop openings 14 which are respectively formed in the first and second regions 111, 112. Each stop opening 14 is interposed between the corresponding retaining opening 12 and the second axial line (L2). Two stop walls 15 are respectively disposed in the stop openings 14. Each stop wall 15 extends in a direction of the first axial line (L1) to bridge the corresponding stop opening 14 and is vaulted in the upright direction (X). Specifically, each stop wall 15 has an upper abutting wall portion 151 above the upper major surface of the plate body 11, and two extending wall portions 152 each extending in the direction of the first axial line (L1) to interconnect the upper abutting wall portion 151 and the upper major surface of the plate body 11.

Figure 6:
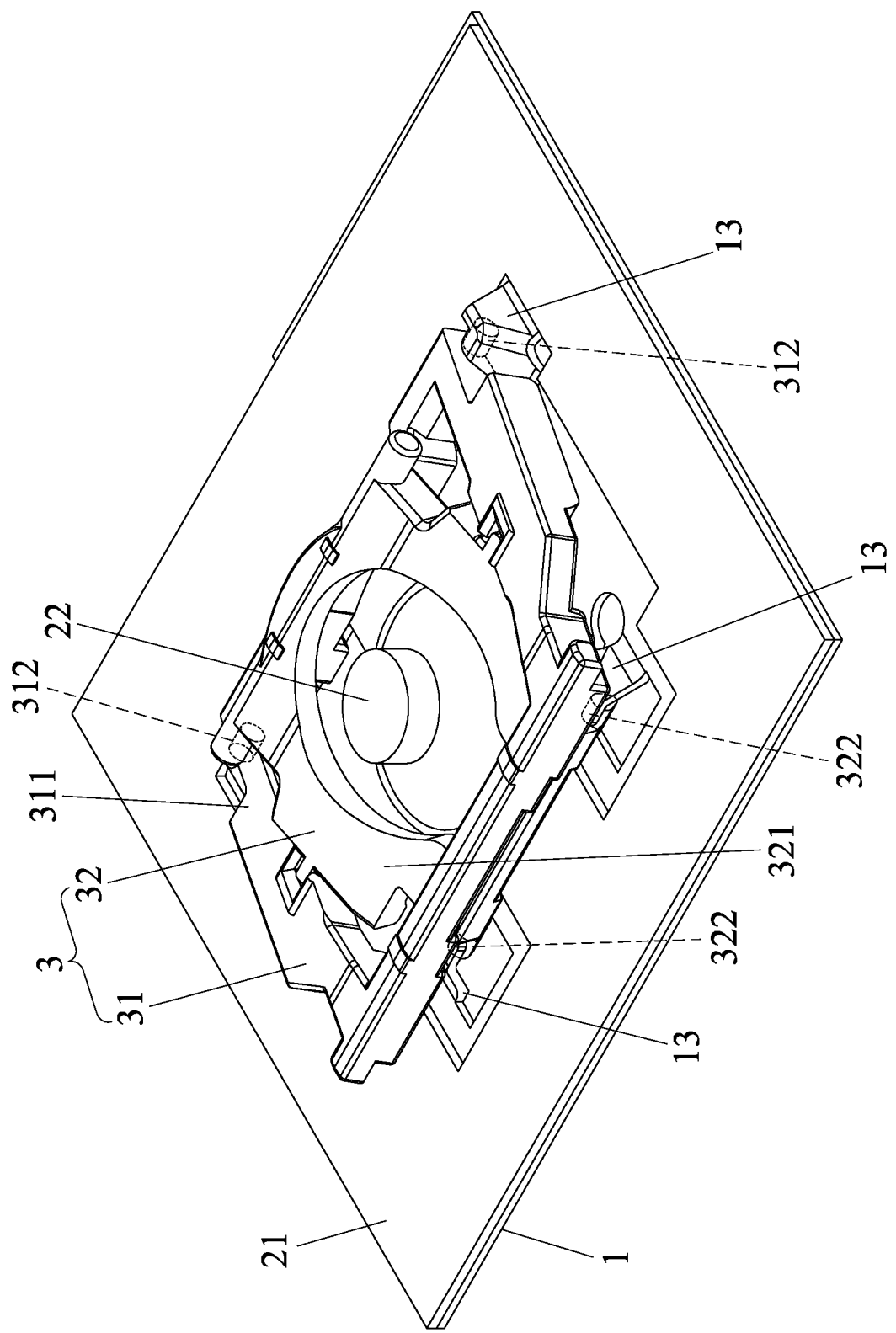
FIG. 6 is a perspective view of the embodiment.
Figure 7:
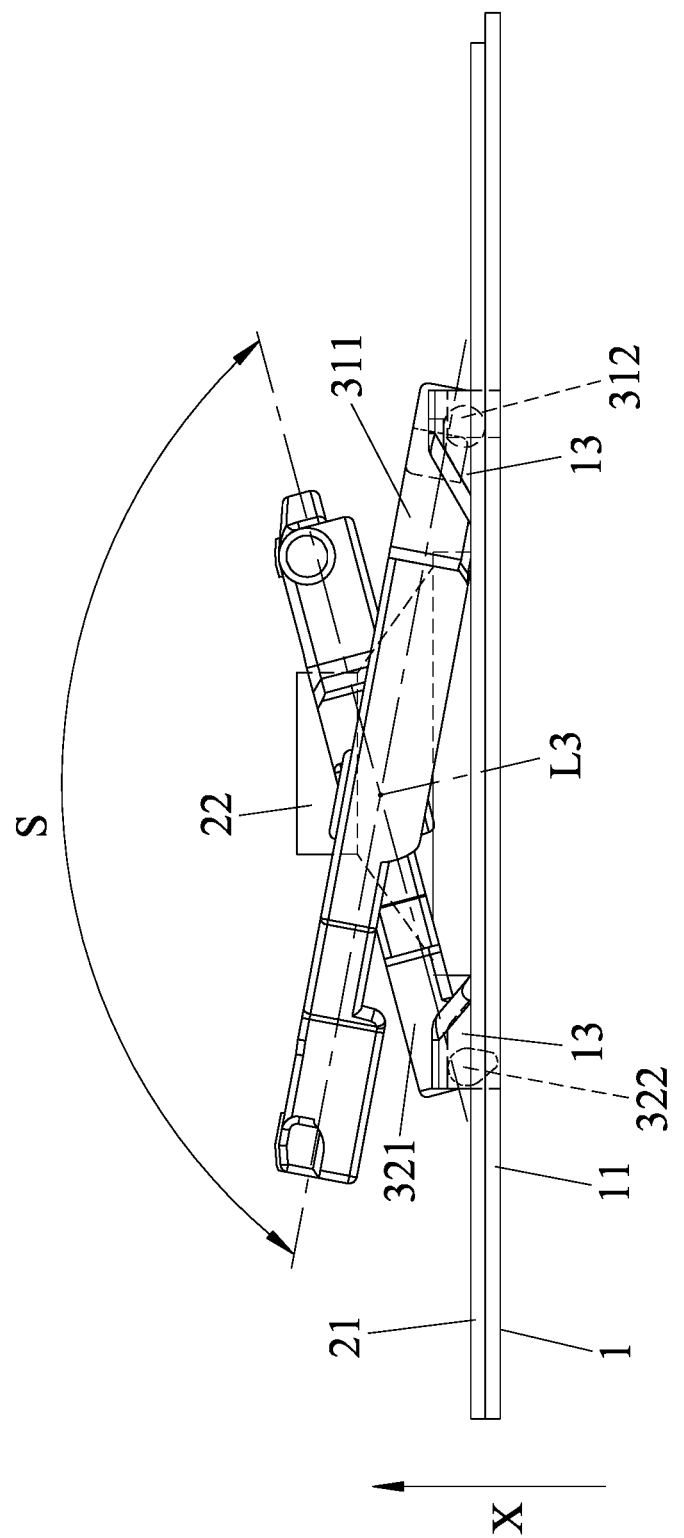
FIG. 7 is a side view illustrating a state when a supporting unit is in an initial position.
Figure 8:
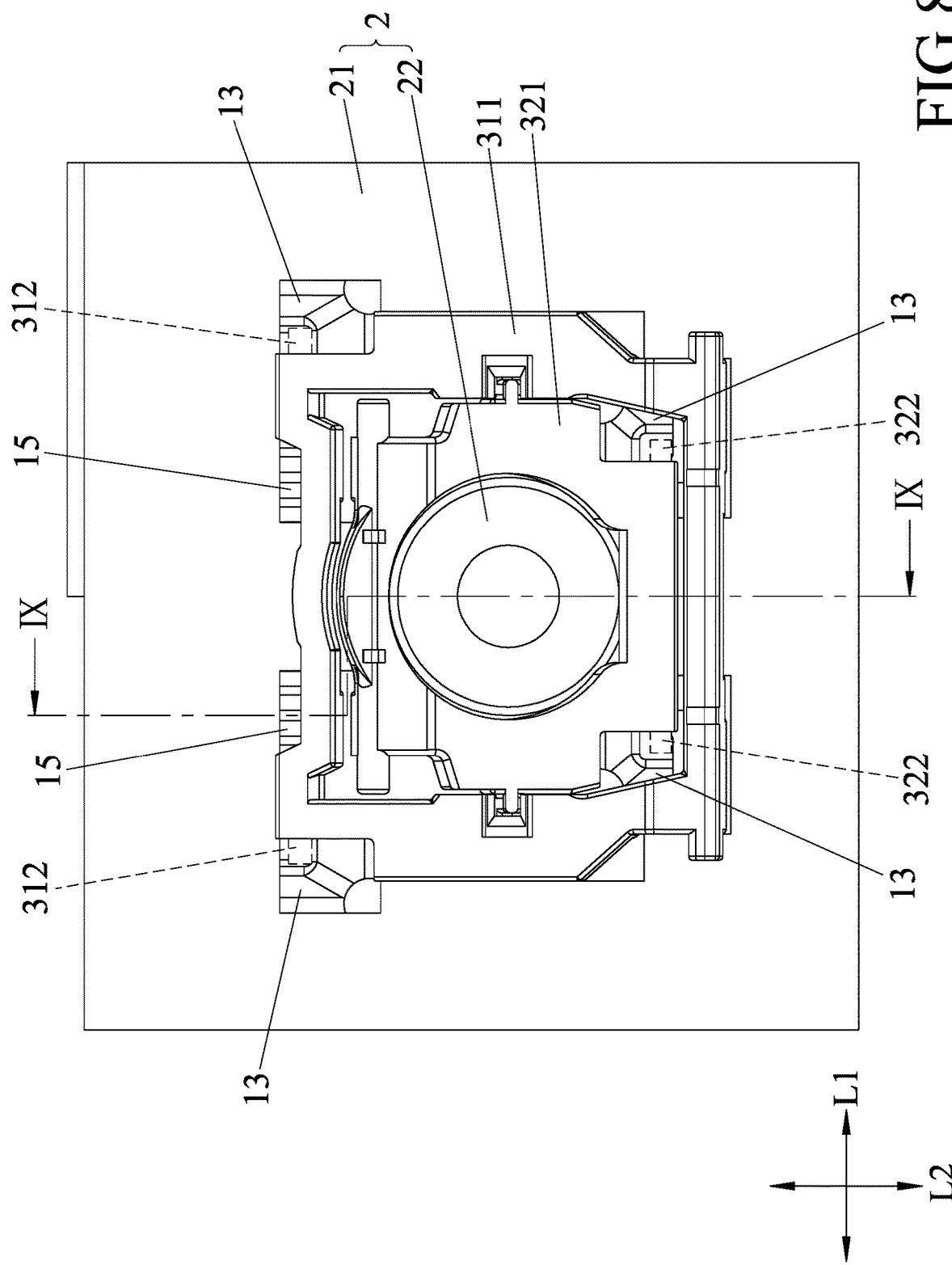
FIG. 8 is a top view illustrating a state when the supporting unit is in the initial position.
Figure 9:
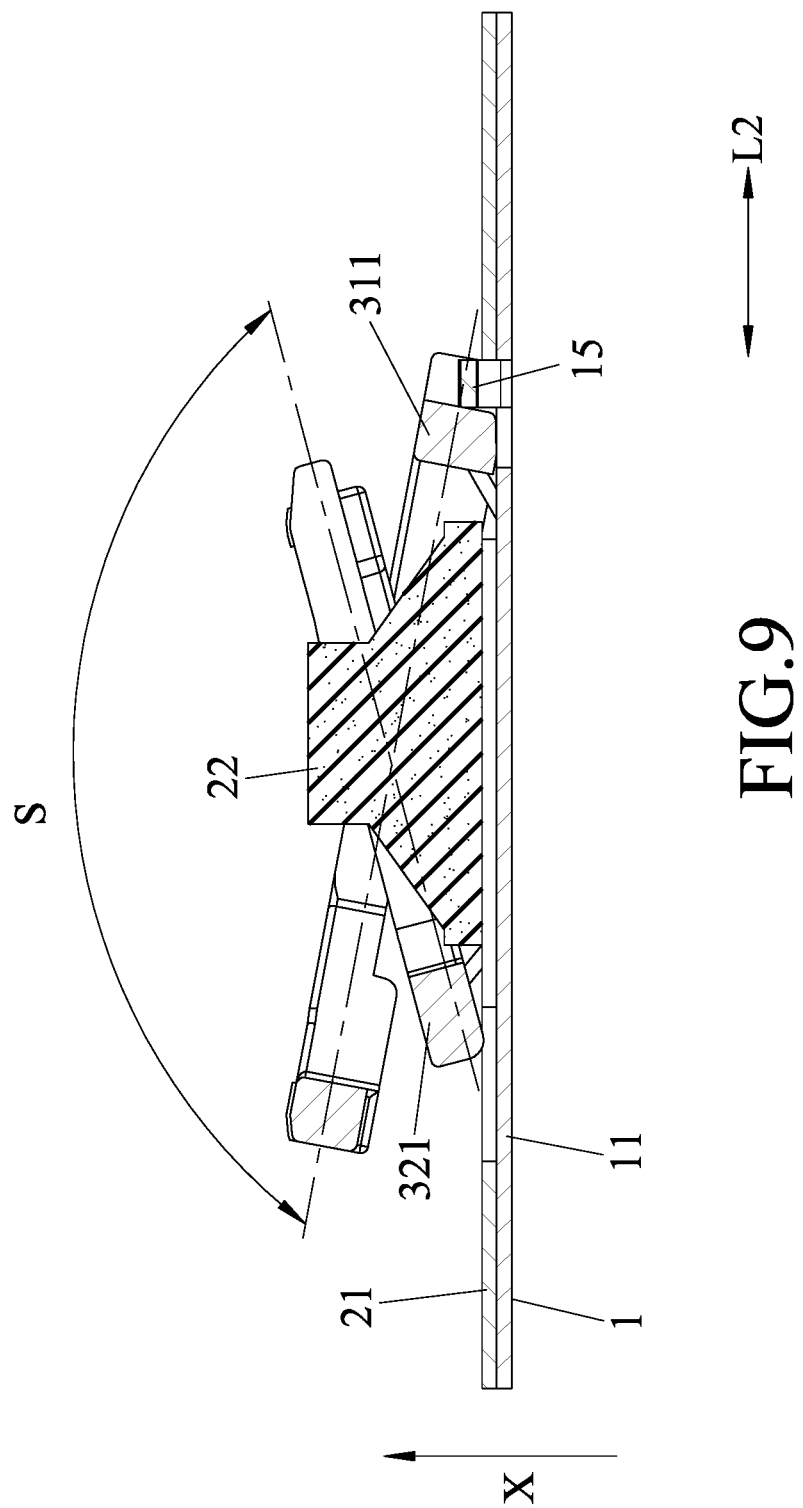
FIG. 9 is a sectional view taken along line IX-IX of FIG. 8.

Referring to FIGS. 3, 6 and 7, the pressing unit 2 is disposed on the base plate 1 along the upright direction (X) and has a center pressing portion 221 substantially located on the reference point (O) to be pressed and generate a pressing signal. Specifically, the pressing unit 2 includes a membrane switch 21 attached to the plate body 11 of the base plate 1, and an elastic member 22 disposed on and extending from the membrane switch 21 in the upright direction (X) and having the center pressing portion 221 to be pressed to generate a pressing signal.

The supporting unit 3 is disposed on the base plate 1 along the upright direction (X), and includes a first supporting frame 31 and a second supporting frame 32 which intersects with the first supporting frame 31 and is pivotably joined thereto at an intersecting axis (L3) to define a supporting included angle (S) such that the first and second supporting frames 31, 32 are pivotable relative to each other about the intersecting axis (L3) to vary the supporting included angle (S). The first supporting frame 31 has a first surrounding frame body 311 which surrounds the elastic member 21 of the pressing unit 2, and two first retaining protrusions 312 which are disposed on the first surrounding frame body 311 and adjacent to the plate body 11. Each of the first retaining protrusions 312 protrudes from the first surrounding frame body 311 along the direction of the first axial line (L1) and away from the second axial line (L2) and is inserted into the corresponding retaining slot 135 at a respective one of the first and second regions 111, 112. The second supporting frame 32 has a second surrounding frame body 321 which surrounds the elastic member 21 of the pressing unit 2 and which is pivotably connected with the first surrounding frame body 311 about the intersecting axis (L3), and two second retaining protrusions 322 which are disposed on the second surrounding frame body 321 and adjacent to the plate body 11. Each of the second retaining protrusions 322 protrudes from the second surrounding frame body 321 along the direction of the first axial line (L1) and away from the second axial line (L2) and is inserted into the corresponding retaining slot at a respective one of the third and fourth regions 113, 114.

The keycap 4 is disposed on the supporting unit 3 in the upright direction (X) and opposite to the plate body 11, and is movable with the supporting unit 3 in the upright direction (X) relative to the base plate 1 such that the supporting unit 3 is movable relative to the base plate 1 between an initial position and a pressed position.

With reference to FIGS. 3, 7, 8 and 9, when the supporting unit 3 is in the initial position, the keycap 4 to which no pressing force is applied is remote from the base plate 1, and the first and second supporting frames 31, 32 are inclined toward the upright direction (X) such that the supporting included angle (S) is the smallest and is not less than 90 degrees. In this state, the first surrounding frame body 311 abuts against the stop walls 15 along a direction of the second axial line (L2) to restrict movement of the first surrounding frame body 311 relative to the base plate 1 in the direction of the second axial line (L2).

Figure 10:
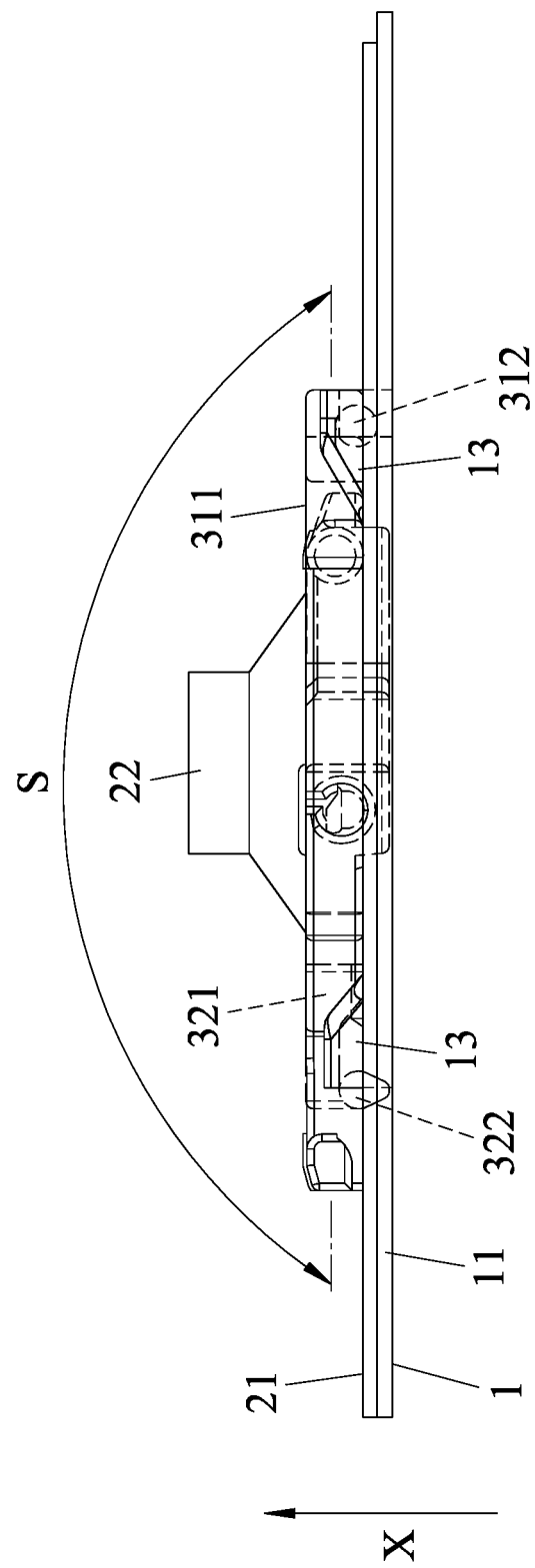
FIG. 10 is a side view illustrating a state when the supporting unit is in a pressed position.
Figure 11:
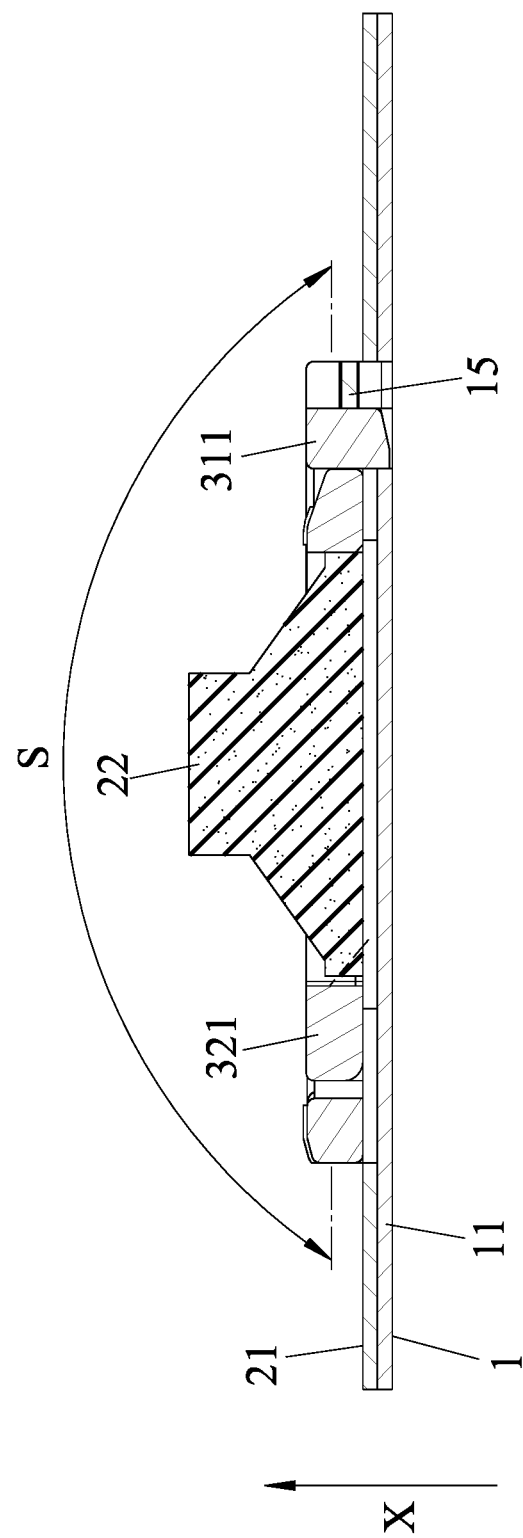
FIG. 11 is a sectional view similar to FIG. 9, illustrating a state when the supporting unit is in the pressed position.

With reference to FIGS. 3, 10 and 11, when the keycap 4 is pressed toward the base plate 1, the supporting unit 3 is moved to the pressed position through sliding and rotating movement of the first and second retaining protrusions 312, 322 in the retaining slots 135. It should be noted that, with the abutment of the first surrounding frame body 311 against the stop walls 15, the first retaining protrusions 312 are rotatable and barely slidable so as to avoid removal of the first retaining protrusions 312 from the corresponding retaining slots 135 along the direction of the second axial line (L2). Moreover, with the pivoted connection between the first and second frame bodies 311, 321, the sliding movement of the second retaining protrusions 322 is restricted so as to avoid removal of the second retaining protrusions 322 from the corresponding retaining slots 135 along the direction of the second axial line (L2).

In the pressed position, the first and second supporting frames 31, 32 spread flat such that the supporting included angle (S) is the largest and is about 180 degrees in this embodiment. Alternatively, the largest supporting included angle (S) may be less than 180 degrees. At this stage, the elastic member 22 is pressed to cause a pressing signal. Releasing the keycap 4 causes the elastic member 22 to restore its original condition so that the keycap 4 restores its initial state and the supporting unit 3 is returned to the initial position.

With the first connecting wall 132 of each retaining member 13 extending along the first edge section 116, and the second connecting wall 133 of each retaining member 13 extending along the second edge section 117, the structural strength of each retaining member 13 is enhanced to bear the impact applied by the first and second retaining protrusions 312, 322 during movement of the supporting unit 3. Moreover, with the broken hole 134 formed at the juncture between the first and second connecting walls 132, 133 to divide the first edge section 116 from the second edge section 117, stress concentration on the juncture between the first and second edge sections 116, 117 is avoided. The thin keyboard apparatus according to the embodiment permits a thinner and durable design.

During a making process of the base plate 1, a flat metal substrate is stamped to form the retaining members 13, the stop walls 15, the retaining openings 12 and the stop openings 14. Since the broken holes 134 which divide the first edge sections 116 from the second edge sections 117 are formed, a forming process of the first and second connecting walls 132, 133 can be readily performed.

Figure 12:
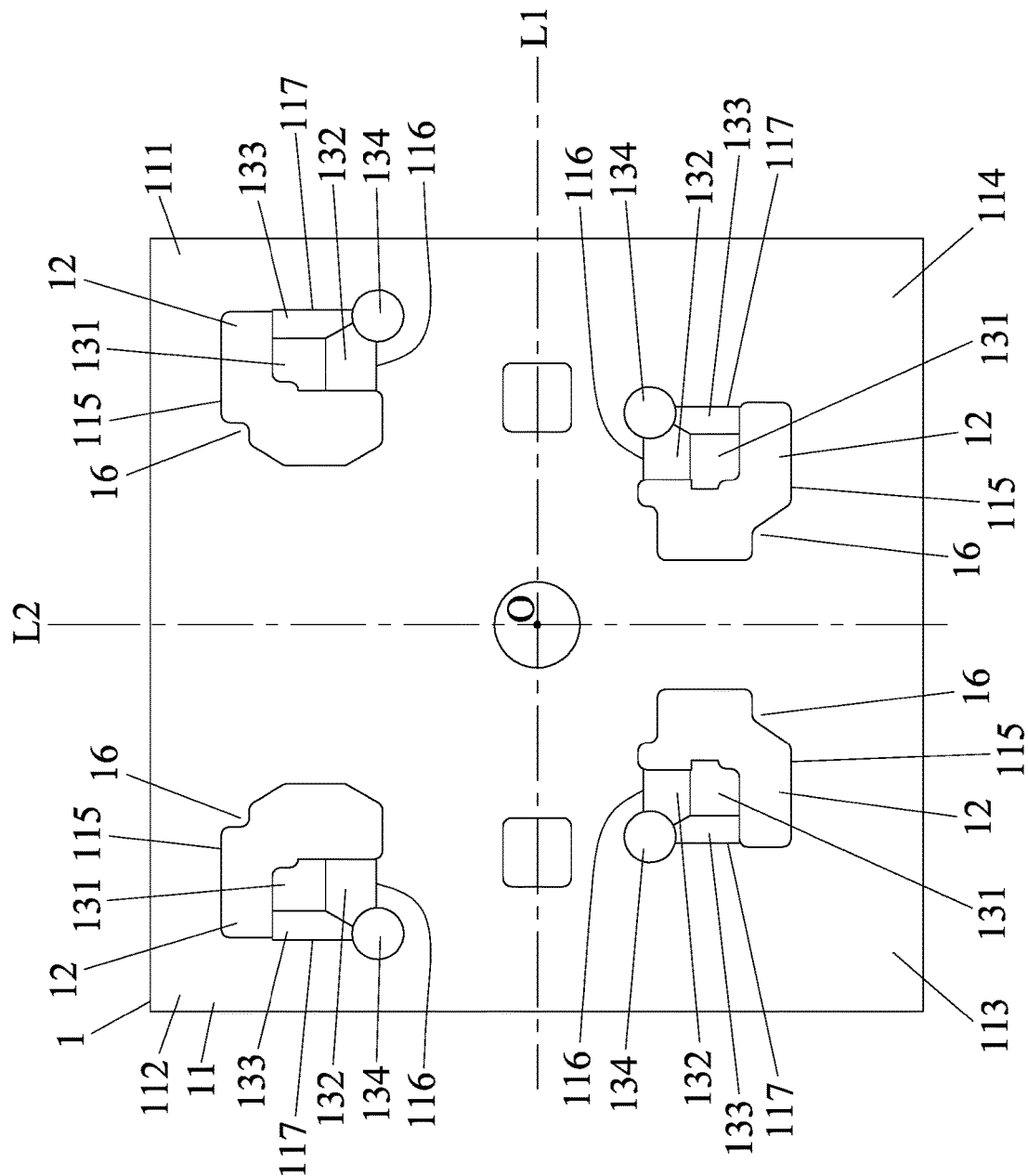
FIG. 12 is a top view illustrating a base plate of another embodiment of the thin keyboard apparatus according to the disclosure.
Figure 13:
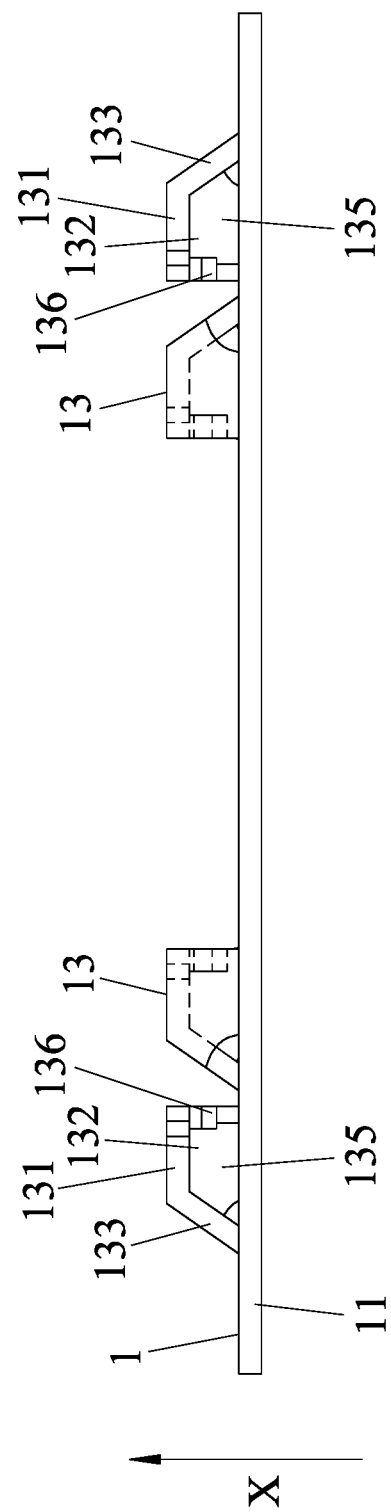
FIG. 13 is a rear view of the base plate of the embodiment shown in FIG. 12.

Referring to FIGS. 12 and 13, in another embodiment, instead of the two stop openings 14 and the two stop walls 15 (as shown in FIG. 4), the plate body 11 of the base plate 1 has four stop members 16 which are respectively disposed in the retaining openings 12. Each of the stop members 16 extends from the peripheral edge 115 in the direction of the second axial line (L2) toward the first axial line (L1). Each of the retaining members 13 further has a holding wall 136 which extends from the upper wall 131 toward the upper major surface of the plate body 11.

Figure 14:
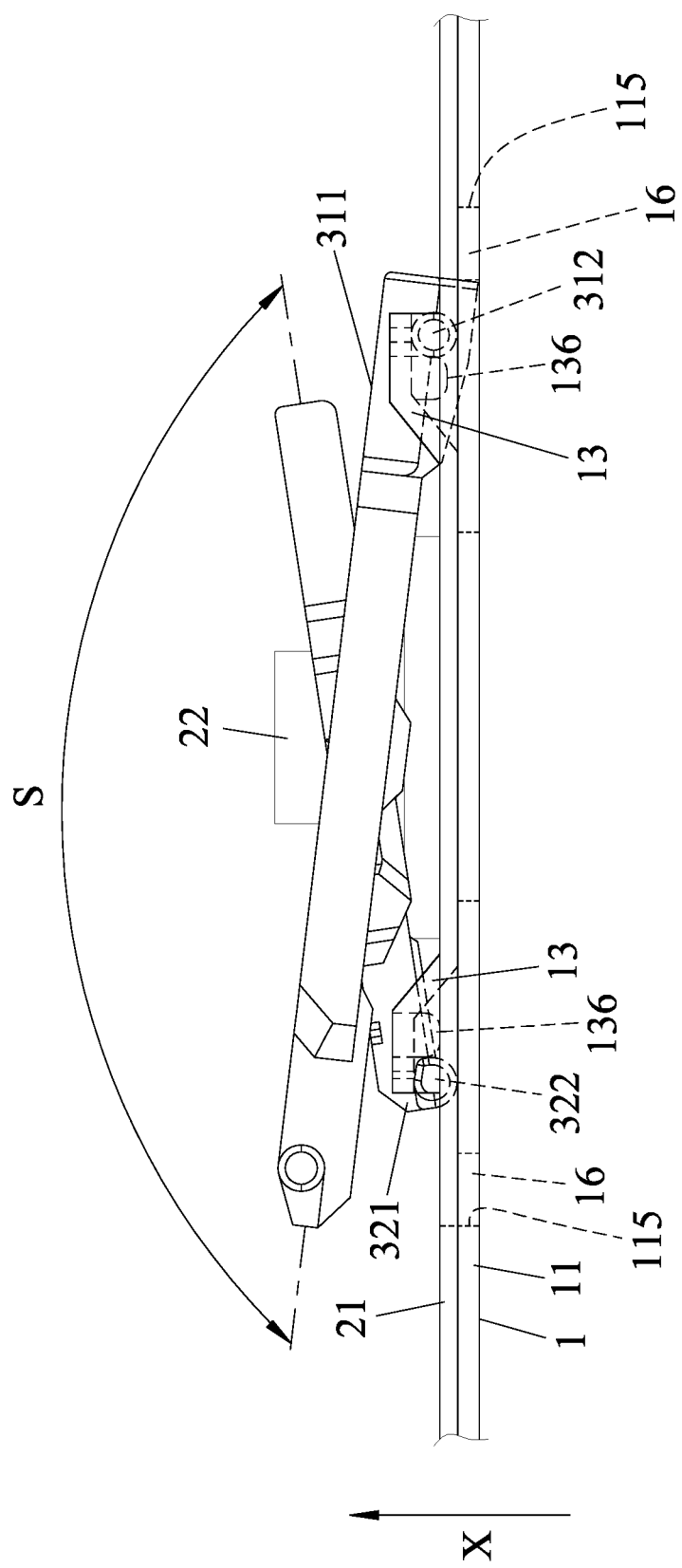
FIG. 14 is a side view illustrating a state when a supporting unit of the embodiment of FIG. 12 is in an initial position.

With reference to FIGS. 12 and 14, in the initial position, the first and second supporting frames 31, 32 are inclined toward the upright direction (X) relative to the base plate 1 such that the supporting included angle (S) is the smallest. In this state, the first and second retaining protrusions 312, 322 of the first and second supporting frames 31, 32 respectively abut against the holding walls 136 in the direction of the second axial line (L2) to confine the supporting included angle (S) to not less than 90 degrees.

Figure 15:
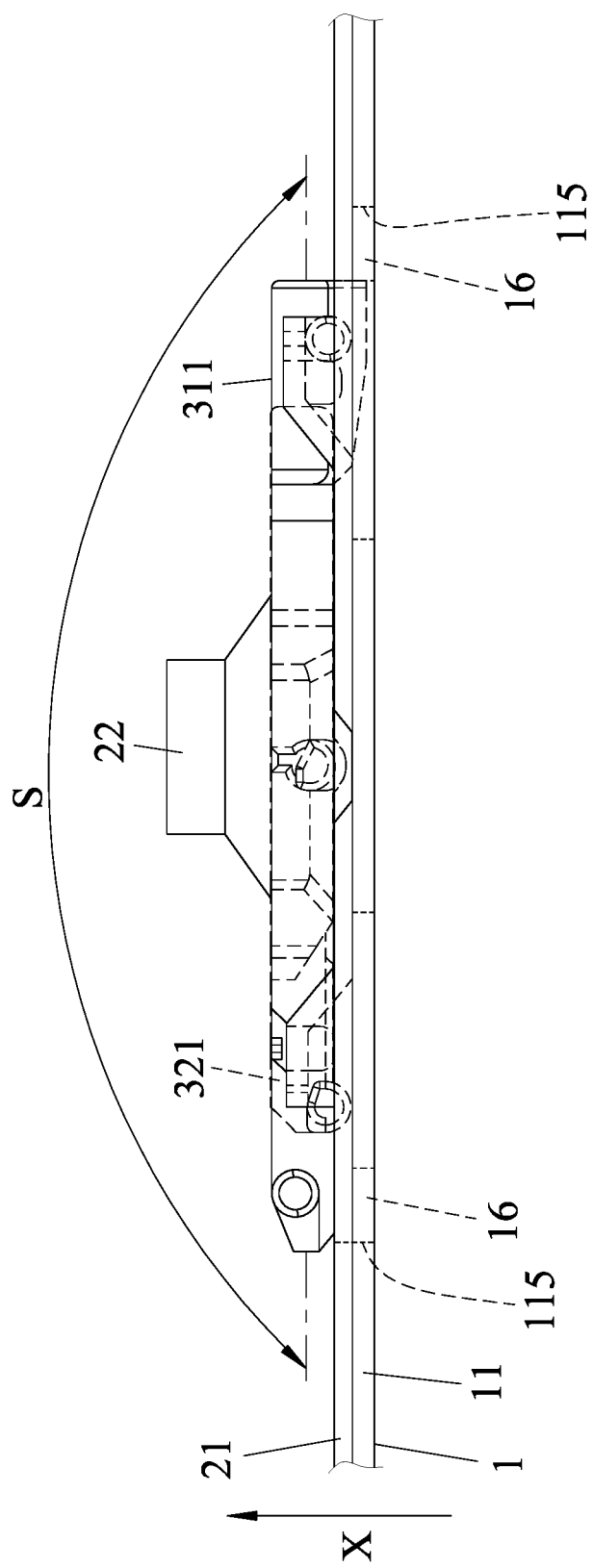
FIG. 15 is a side view illustrating a state when the supporting unit is in a pressed position.

With reference to FIGS. 12 and 15, when the supporting unit 3 is pressed to the pressed position, the first surrounding frame body 311 abuts against the stop members 16 along the direction of the second axial line (L2) to restrict movement of the first surrounding frame body 311 relative to the base plate in the direction of the second axial line (L2) so as to avoid removal of the first and second retaining protrusions 312, 322 from the corresponding retaining slots 135. As such, in making the base plate 1, the holding wall 136 is designed with different dimension to determine the smallest value of the supporting included angle (S).

As illustrated, with the first and second connecting walls 132, the structural strength of each retaining member 13 is enhanced. With the broken hole 134, stress concentration is avoided. The thin keyboard apparatus according to the disclosure permits a thinner and durable design.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A thin keyboard apparatus comprising:
a base plate having a plate body which defines thereon a first axial line and a second axial line that is perpendicular to said first axial line and intersects said first axial line at a reference point, said plate body having an upper major surface which is divided by said first and second axial lines into first, second, third and fourth regions, said first region being adjoined to said second region along said second axial line, and being adjoined to said fourth region along said first axial line, said third region being adjoined to said second region along said first axial line, and being adjoined to said fourth region along said second axial line, said plate body having four retaining openings which are respectively formed in said first, second, third and fourth regions, each of said retaining openings being bordered by a peripheral edge, said peripheral edge including a first edge section which extends substantially parallel to and proximate to said first axial line, and a second edge section which extends substantially parallel to and remote from said second axial line, said plate body further having four retaining members which are respectively disposed in said retaining openings, each of said retaining members having an upper wall which is spaced apart from said upper major surface of said plate body in an upright direction that is normal to said upper major surface, a first connecting wall which interconnects said upper wall and said first edge section and which extends along said first edge section, a second connecting wall which interconnects said upper wall and said second edge section and which extends along said second edge section, and a broken hole which is formed at a juncture between said first and second connecting walls to divide said first edge section from said second edge section, said upper wall, said first connecting wall and said second connecting wall cooperatively defining a retaining slot;
a pressing unit disposed on said base plate along said upright direction and having a center pressing portion substantially located on said reference point to be pressed and generate a pressing signal;
a supporting unit disposed on said base plate along said upright direction, and including a first supporting frame and a second supporting frame which intersects with said first supporting frame and is pivotably joined thereto at an intersecting axis to define a supporting included angle such that said first and second supporting frames are pivotable relative to each other about said intersecting axis to vary said supporting included angle, said first supporting frame having a first surrounding frame body which surrounds said center pressing portion, and two first retaining protrusions which are disposed on said first surrounding frame body and adjacent to said plate body, said first retaining protrusions protruding from said first surrounding frame body along a direction of said first axial line and away from said second axial line and being respectively inserted into said retaining slots at said first and second regions, said second supporting frame having a second surrounding frame body which surrounds said center pressing portion and which is pivotably connected with said first surrounding frame body about said intersecting axis, and two second retaining protrusions which are disposed on said second surrounding frame body and adjacent to said plate body, said second retaining protrusions protruding from said second surrounding frame body along said direction of said first axial line and away from said second axial line and being respectively inserted into said retaining slots at said third and fourth regions; and a keycap disposed on said supporting unit in said upright direction and opposite to said plate body, and movable with said supporting unit in said upright direction relative to said base plate.

2. The thin keyboard apparatus as claimed in claim 1, wherein said pressing unit includes a membrane switch attached to said plate body of said base plate, and an elastic member disposed on and extending from said membrane switch in said upright direction and having said center pressing portion to be pressed to generate a pressing signal.

3. The thin keyboard apparatus as claimed in claim 1, wherein said plate body of said base plate further has two stop openings which are respectively formed in said first and second regions, each of said stop openings being interposed between said corresponding retaining opening and said second axial line, and two stop walls which are respectively disposed in said stop openings, each of said stop walls extending in said direction of said first axial line to bridge said corresponding stop opening and being vaulted in said upright direction such that said first surrounding frame body abuts against said stop walls along a direction of said second axial line to restrict movement of said first surrounding frame body relative to said base plate in said direction of said second axial line.

4. The thin keyboard apparatus as claimed in claim 1, wherein said plate body of said base plate further has four stop members which are respectively disposed in said retaining openings, each of said stop members extending from said peripheral edge in a direction of said second axial line toward said first axial line such that said first surrounding frame body abuts against said stop members along said direction of said second axial line to restrict movement of said first surrounding frame body relative to said base plate in a direction of said second axial line, each of said retaining members having a holding wall which extends from said upper wall toward said upper major surface of said plate body such that a corresponding one of said first and second retaining protrusions abuts against said holding wall in said direction of said second axial line to confine said supporting included angle in an initial position of said supporting unit.

\* \* \* \* \*